US008591300B2

(12) United States Patent (10) Patent No.: US 8,591,300 B2
Slessman et al. (45) Date of Patent: Nov. 26, 2013

(54) THERMAL MANAGEMENT CABINET FOR ELECTRONIC EQUIPMENT (75) Inventors: George Slessman, Scottsdale, AZ (US); Alex Goldman, Northbrook, IL (US); Kevin Melotti, Portage, MI (US); Peter Reo, Indianapolis, IN (US); Jonathan Williams, Belleville, MI (US)

(73) Assignee: IO Data Centers, LLC, Phoenix, AZ (US)

( * ) Notice: Subject to any disclaimer, the term of this patent is extended or adjusted under 35 U.S.C. 154(b) by 319 days.

(21) Appl. No.: 12/631,544

(22) Filed: Dec. 4, 2009

(65) Prior Publication Data
US 2010/0151781 A1 Jun. 17, 2010

Related U.S. Application Data (63) Continuation of application No. 12/626,114, filed on Nov. 25, 2009.

(60) Provisional application No. 61/119,980, filed on Dec. 4, 2008.

(51) Int. Cl.
*H05K 5/00* (2006.01)
(52) U.S. Cl.
USPC .......................................................... 454/184
(58) Field of Classification Search
USPC .......................................................... 454/184
See application file for complete search history.

(56) References Cited

U.S. PATENT DOCUMENTS

| 4,261,519 | A | 4/1981 | Ester |
| 5,223,006 | A | 6/1993 | Moran, III |
| 6,535,382 | B2 | 3/2003 | Bishop et al. |
| 6,557,357 | B2 * | 5/2003 | Spinazzola et al. ............... 62/89 |
| 6,672,955 | B2 | 1/2004 | Charron |
| 6,678,156 | B2 * | 1/2004 | Moizer .......................... 361/690 |
| 6,745,579 | B2 * | 6/2004 | Spinazzola et al. ............... 62/89 |
| 6,867,967 | B2 * | 3/2005 | Mok ......................... 361/679.49 |
| 7,112,131 | B2 * | 9/2006 | Rasmussen et al. .......... 454/184 |
| 7,379,298 | B2 * | 5/2008 | Walsh et al. .................. 361/692 |
| 7,430,118 | B1 | 9/2008 | Noteboom et al. |
| 7,438,124 | B2 * | 10/2008 | Bhatti et al. .................. 165/248 |
| 7,542,287 | B2 * | 6/2009 | Lewis et al. .................... 361/695 |
| 7,660,117 | B2 * | 2/2010 | Werner et al. ................ 361/696 |

(Continued)

OTHER PUBLICATIONS

Supplementary Extended European Search Report, Application No. EP 09 831 226.7, European Search Authority, Apr. 18, 2013, 8 pages.

*Primary Examiner* — Steven B McAllister
*Assistant Examiner* — Jamil Decker (57) ABSTRACT A thermal management cabinet for electronic equipment such as servers, having an opening in the top and bottom of the cabinet. The cabinet extends between a raised access floor of a building carrying cooled air and a drop ceiling for venting heated air. The bottom opening of the cabinet is alignable with an opening in the access floor such that cool air can pass into the cabinet and can flow through the electronic component storage area to the top opening, which is alignable with an opening in the drop ceiling. The cabinet interior is separated into temperature zones comprising at least a cold zone supplied with air from the access floor and a hot zone for venting through the top opening. At least one baffle creates the temperature zones such that air is directed to flow from the cold zone through the electronic component storage area to the hot zone.

10 Claims, 9 Drawing Sheets

(56) References Cited

U.S. PATENT DOCUMENTS

| | | | |
|---|---|---|---|
| 7,746,634 B2 * | 6/2010 | Hom et al. | 361/679.53 |
| 7,782,612 B2 * | 8/2010 | Walsh et al. | 361/690 |
| 7,817,419 B2 * | 10/2010 | Illerhaus | 361/692 |
| 7,907,402 B2 * | 3/2011 | Caveney | 361/694 |
| 2002/0055329 A1 * | 5/2002 | Storck et al. | 454/186 |
| 2002/0059804 A1 | 5/2002 | Spinazzola et al. | |
| 2002/0153816 A1 * | 10/2002 | Banicevic et al. | 312/404 |
| 2004/0023614 A1 | 2/2004 | Koplin | |
| 2004/0227435 A1 * | 11/2004 | Rasmussen | 312/236 |
| 2004/0257766 A1 * | 12/2004 | Rasmussen et al. | 361/689 |
| 2006/0082263 A1 | 4/2006 | Rimler et al. | |
| 2006/0260338 A1 | 11/2006 | VanGilder et al. | |
| 2007/0025271 A1 | 2/2007 | Niedrich et al. | |
| 2007/0183129 A1 | 8/2007 | Lewis, II et al. | |
| 2007/0213000 A1 * | 9/2007 | Day | 454/184 |
| 2008/0055850 A1 * | 3/2008 | Carlson et al. | 361/695 |
| 2008/0123288 A1 | 5/2008 | Hillis | |

* cited by examiner

FIG. 13

THERMAL MANAGEMENT CABINET FOR ELECTRONIC EQUIPMENT

CROSS-REFERENCE TO RELATED APPLICATIONS

This is a continuation of U.S. patent application Ser. No. 12/626,114, filed Nov. 25, 2009, which claims the benefit of U.S. Provisional Application No. 61/119,980, filed Dec. 4, 2008.

FIELD OF THE INVENTION

The present application relates to thermal management cabinets for electronic equipment, and particularly to a cabinet system designed to aid in cooling servers and other computing equipment.

BACKGROUND

Data centers typically involve a large number of rack-mounted servers that are housed together in cabinets. Cooling of such server racks and cabinets is a major problem, particularly as processors typically produce large amounts of heat. It has been found that for every 1 watt of power used for Information Technology, 0.5 to 2 watts of power are used for cooling the electronic components, and thus the need for cooling uses a very high percentage of the total IT power consumption. The power dissipation of high-performance CPU processors is predicted to exceed 150 W in the near future. The high-density packing of servers and the desire for lower CPU junction temperatures to achieve higher reliability of components means that thermal management of server racks is an increasing concern. Various solutions have been proposed, many of which involve large numbers of fans to keep a constant airflow over the electronic components. However, such solutions suffer from drawbacks associated with the power supply needed to power the fans, as well as reliability of such fans.

In a number of solutions, server cabinets are placed on a false floor with cool air from an HVAC system being supplied through the false floor to a vent in front of the cabinet. The cooling airflow is then drawn front-to-back through the cabinet using fans, and vented out to the back of the cabinet. With such arrangements, it is desirable to use a "hot-aisle/cold-aisle" arrangement so that server fronts are arranged facing one another so that two aisles can draw cool air from a single vent area, and so that the server backs also face one another. The hot air is then allowed to vent to air return units in the ceiling. This can lead to "hot spots" in the server room, however, much of the hot air can also mix with the cool air circulating in the room. Various solutions to such problems involve the use of baffles extending from the top of the server cabinet to the ceiling to try to prevent some of the mixing between the hot and cold air.

The maximum allowed temperature range for a server in a data center is 59 to 90 degrees Fahrenheit, while the recommended temperature is between 68 and 77 degrees Fahrenheit. As the known data center storage solutions typically allow some mixing of air prior to the air reaching the electronic components, data centers typically pump cold air at between 55 and 60 degrees Fahrenheit to account for the temperature increase in the air before it can act to cool the components. The American Society of Heating, Refrigeration and Air-conditioning Engineers (ASHRAE) has suggested that it would be beneficial if cold air could be conveyed directly to servers without mixing with hot air, which would allow the cooled air to be provided from the air handler to be warmer while still allowing the server temperature to remain within the recommended standard temperature ranges.

SUMMARY

In accordance with one aspect of the exemplary embodiments, a thermal management cabinet for electronic equipment includes a cabinet frame having side walls and defining a front, a back, a top and a bottom, the cabinet forming a generally sealed enclosure for electronic equipment. An electronic component storage area including at least one shelving rack for supporting electronic equipment is defined in an interior section of the cabinet. At least one opening is included in the top of the cabinet, and at least one opening is included in the bottom of the cabinet. The cabinet is dimensioned to extend between a raised access floor of a building and a drop ceiling of a building, the access floor carrying cooled air and the drop ceiling venting heated air. The bottom opening of the cabinet is alignable with an opening in the access floor such that cool air from the access floor passes into the cabinet and flows through the electronic component storage area to exit the cabinet through the top opening, which is alignable with an opening in the drop ceiling.

The cabinet interior can be separated into temperature zones comprising at least a cold zone supplied with air from the bottom opening of the cabinet and a hot zone for venting through the top opening, with at least one baffle provided to create the temperature zones such that air is directed to flow from the cold zone through the electronic component storage area to the hot zone.

In one arrangement, the baffle can comprise a thermal management plate that is positioned horizontally in the cabinet above the electronic component storage area. The thermal management plate can be formed of insulated material such as a plastic material backed with an insulator.

In another arrangement, the baffle can comprise a heat transfer curtain that is positioned vertically in the cabinet above the electronic component storage area. The heat transfer curtain can be formed of a composite material.

In another arrangement, the baffle can be flexible and can allow cables to be passed through areas of the cabinet while providing a heat transfer barrier. The flexible baffle can comprise at least one of flexible fingers, foam insulation and brushes. The flexible fingers and brushes can extend from the electronic component storage area to at least one of the side walls, front and back of the cabinet. The at least one foam insulation can comprise two flexible foam pieces positioned to allow cables to be passed therebetween.

A duct can extend from the top opening of the cabinet for connection to a drop ceiling. The duct can be formed of a flexible material such as a fabric material.

At least one door can be provided in at least one of the front and back of the cabinet. The at least one door can be a double door. Insulation pieces can be provided adjacent at least one hinged edge of the at least one door. The insulation pieces can form a flexible baffle, and can comprise two flexible foam pieces positioned to allow cables to be passed therebetween.

At least one side of the cabinet can include a removable panel. At least one punch hole having a removable plug can be provided in at least one side of the cabinet.

At least one airflow management structure can be provided adjacent to the bottom opening of the cabinet, which may be a perforated curtain.

The above-described and other features and advantages of the present disclosure will be appreciated and understood by those skilled in the art from the following detailed description, drawings, and appended claims.

DETAILED DESCRIPTION OF THE INVENTION

The exemplary embodiments of the present disclosure are described with respect to a thermal management cabinet for electronic equipment. It should be understood by one of ordinary skill in the art that the exemplary embodiments of the present disclosure can be applied to other types of thermal management systems.

Referring to the drawings, an exemplary thermal management cabinet is illustrated. The cabinet 10 has generally solid side walls 12, a front 14 and a back 16. The cabinet may be used to house a plurality of servers 15 or other pieces of electronic equipment. Suitable dimensions for the cabinet include a height of 7 feet, a width of 3 feet and a depth of 4 feet, although it will be appreciated that the dimensions can be varied to suit any particular application.

The cabinet 10 may include generally L-shaped horizontal rails 17 attached to and supported by four vertical rail supports 18 which form part of a frame 19 that is positioned in the interior of the cabinet 10. A plurality of rails 17 may be provided in pairs to form shelving brackets on which electronic components can be supported. The rails may have any suitable formation, one suitable formation being standard square hole rails that may be positioned 19" apart to form a 19" rack. The rails may be mounted to the vertical rail supports 18 and define the depth of the racks for housing the electronic components 15. The vertical rail supports 18 and the rails 17 define an electronic component storage area 20 that is located within the frame 19. The positioning of the frame 19 defines a front service area 21 forward of the frame to the front 14 of the cabinet, a rear service area 22 rearward of the frame to the back 16 of the cabinet 10. Two side service areas 23 are defined to the sides of the frame 19. The cabinet can be designed to be 42 U in height, with "U," or rack unit, being a unit of measure used to describe the height of equipment intended for mounting in a 19-inch rack or a 23-inch rack (the dimension referring to the width of rack). One rack unit is 1.75" (44.45 mm) high. Thus, a suitable number of rails 17 can be provided to equal the desired height of the cabinet, with the rails being spaced a suitable number of rack units apart.

An insulated thermal management plate 24 can be provided, which can be moved within the cabinet 10. The thermal management plate 24 can be formed of any suitable material. In one arrangement, the plate 24 can be formed of ABS plastic with a foam insulation backing. The thermal management plate 24 extends from the front 14 of the cabinet 10 towards the back 16, typically to the rear vertical rail support 18 which marks the front end of the rear service area 22. The electronic components to be housed within the cabinet 10 can be stored within the cabinet starting from the lowest rack and working upwards. The thermal management plate 24 is easily movable within the cabinet and is typically placed within the cabinet 10 just above the height of the highest electronic component that is stored within the cabinet 10. The plate 24 may be attached to the rails 17 that are positioned directly above the topmost electronic component, or may simply be rested thereon. At the front edge of the thermal management plate 24, the corners may be cut off.

An insulated thermal curtain 25 can be provided at the back 16 of the cabinet 10. The thermal curtain 25 is preferably made of a composite material, though can be formed of any suitable material. The curtain 25 can be suspended from a spring loaded or ratcheted roller mechanism 26 that is attached at the top of the frame 19. The curtain 25 can either be mounted within or adjacent to the rear rail supports 18 such that it is located at the edge of the rear service area 22. A bottom bracket 28 enables the curtain 25 to be easily raised and lowered. Typically, the curtain is lowered until it is level with the thermal management plate 24. The curtain 25 can be formed of a thermal insulating material that prevents heat transfer. U-markings 30 may be provided on the curtain at 1.75" intervals, along with a company logo for the cabinet manufacturer. With a 19" rack width, the curtain 25 can be 20" wide. The curtain 25 can run in vertical U-shaped rails 32 attached to the vertical rail supports 18 such that the curtain provides a generally sealed barrier to the transport of air. It should be appreciated, that although the arrangement illustrated in FIGS. 1-7 has curtain 25 provided at the back 16 of the cabinet 10, it may alternatively or in addition be provided at the sides of the cabinet, and/or at only one of the front, back or sides of the cabinet. In the arrangement of FIGS. 8-11, the thermal curtain 25 is positioned at the front of the cabinet 10.

The thermal management plate 24 and the thermal curtain 25 can be used to separate the interior space of the cabinet 10 into different zones by forming baffles to the air flow and heat transfer. A cold zone is defined within the front service area 21, bounded at the rear by the electronic components that are stored within the racks, and at the top by the thermal management plate 24. The front door, the sides 12 and the bottom of the cabinet 10 form the other boundaries of the cold zone. A hot zone is defined within the rear service area 22, bounded at the front by the electronic components that are stored within the racks and by the thermal curtain 25 that extends from the top of the cabinet 10 to the thermal management plate 24. The sides 12, the rear door, the bottom and the top of the cabinet 10 form the other boundaries of the hot zone. A neutral heat zone is formed above the cold zone, defined between the top of the cabinet 10, the thermal management plate 24, the sides 12 of the cabinet, the front door of the cabinet 10 and the thermal curtain 25. Thus, the hot zone typically forms the entire volume of the rear service area 22, while the front service area 21 and the electronic component storage area 20 are split vertically by the horizontally-oriented plate 24 into the neutral heat zone at the top and the cold zone at the bottom. Air flow within the cabinet is designed to go first from the cold zone rearwardly through the electronic component storage area 20 where it becomes heated due to contact with the electronic components therein and exits into the hot zone. The air then flows vertically upwards within the hot zone to exit the cabinet. The neutral zone is designed to be cut off from this air flow by the thermal management plate 24 and the thermal curtain 25. The neutral zone formed above the thermal management plate 24 can be used for storage for equipment such as laptops or other devices.

In alternative arrangements, a thermal curtain 25 may be provided without provision of a thermal management plate 24, in which case the thermal curtain may be positioned to either the front or back of the storage area 20, or at any location therebetween such as at the center thereof. The thermal curtain 25 can be mounted to the top of the cabinet, and can be simply extended downwardly until it reaches the topmost electronic component stored in the storage area 20. This arrangement thus splits the interior of the cabinet 10 into a hot zone and a cold zone by vertically dividing the space using the thermal curtain 25.

Figure 1:
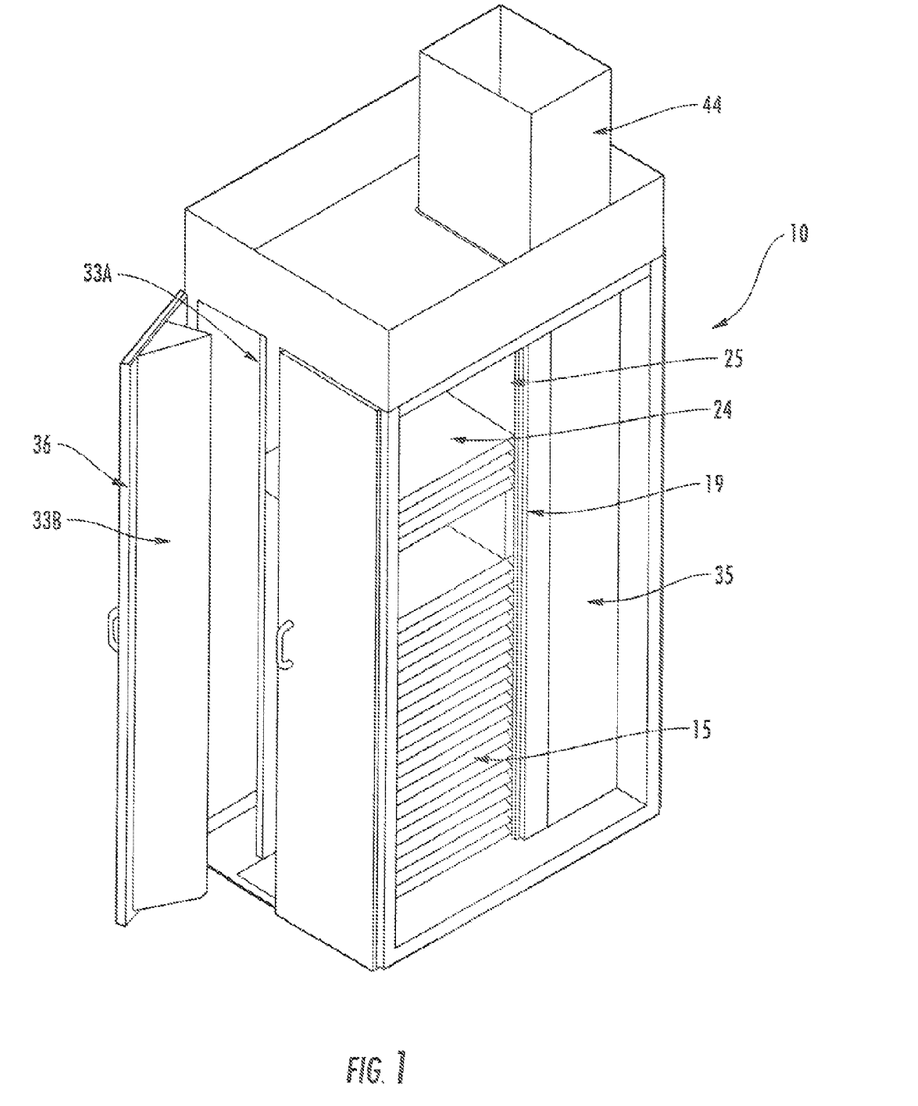
FIG. 1 is a perspective isometric view of a thermal management cabinet according to arrangements of the present invention, with side panels removed.
Figure 2:
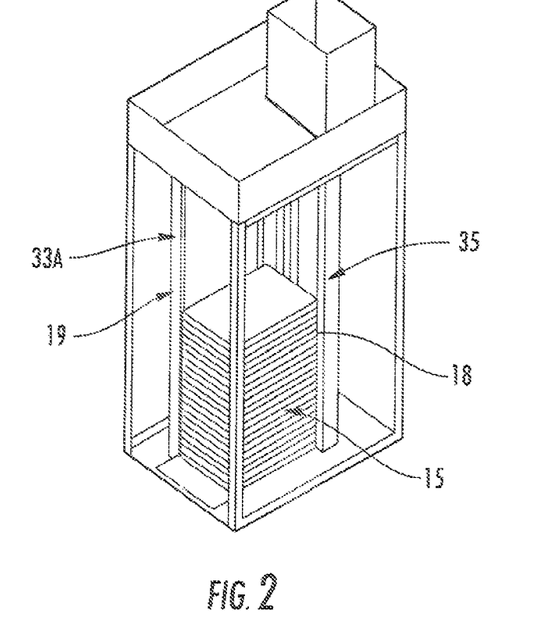
FIG. 2 is a perspective isometric view of the thermal management cabinet of FIG. 1 with doors and baffles removed.
Figure 3:
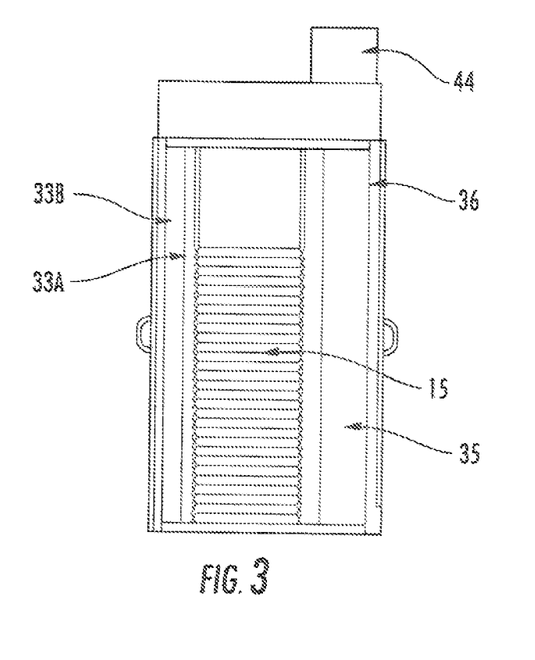
FIG. 3 is a side view of the thermal management cabinet of FIG. 1.
Figure 4:
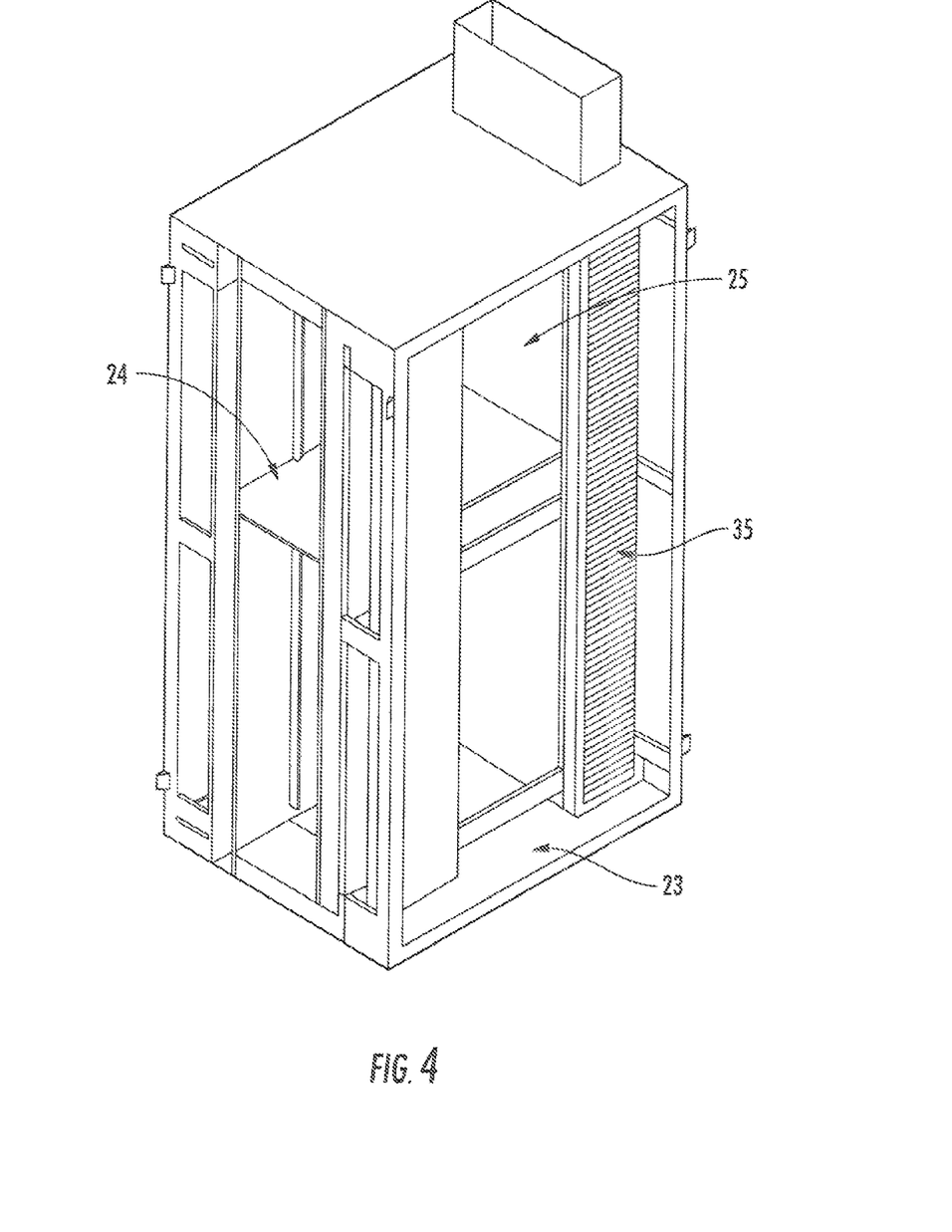
FIG. 4 is a perspective isometric view of the thermal management cabinet of FIG. 1, with servers removed.
Figure 5:
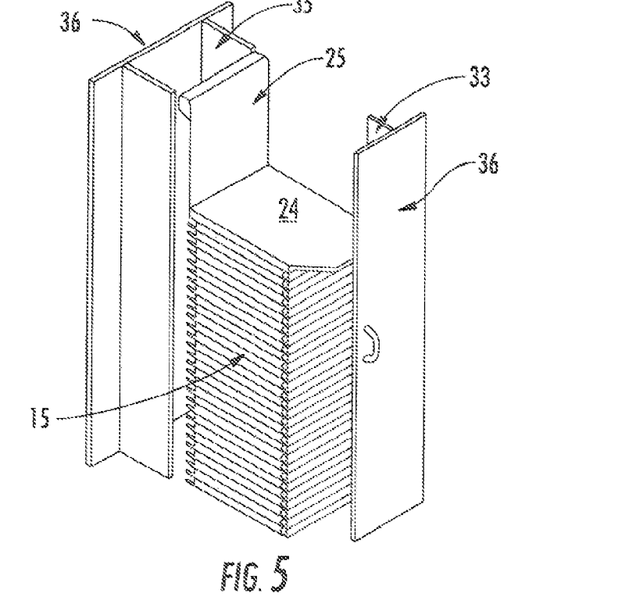
FIG. 5 is a perspective isometric view of the interior components of the thermal management cabinet of FIG. 1.
Figure 6:
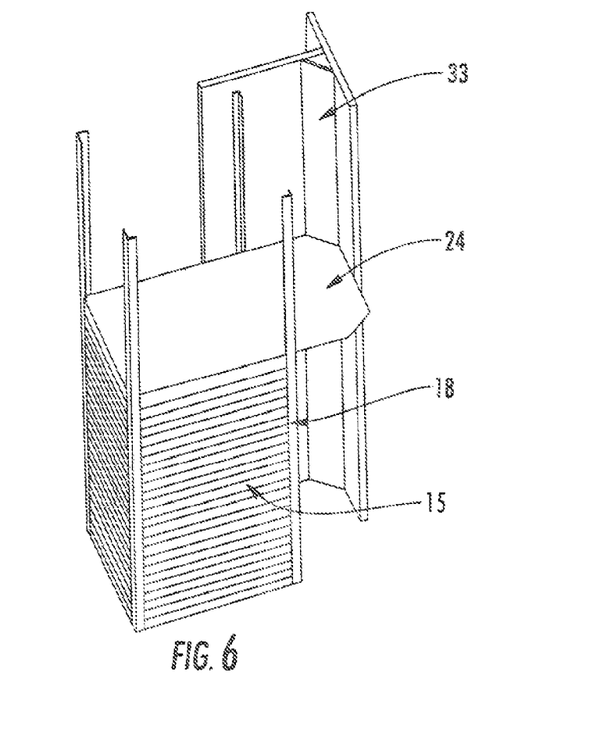
FIG. 6 is a side perspective view of the interior components of the thermal management cabinet of FIG. 1, showing the foam door seal.
Figure 7:
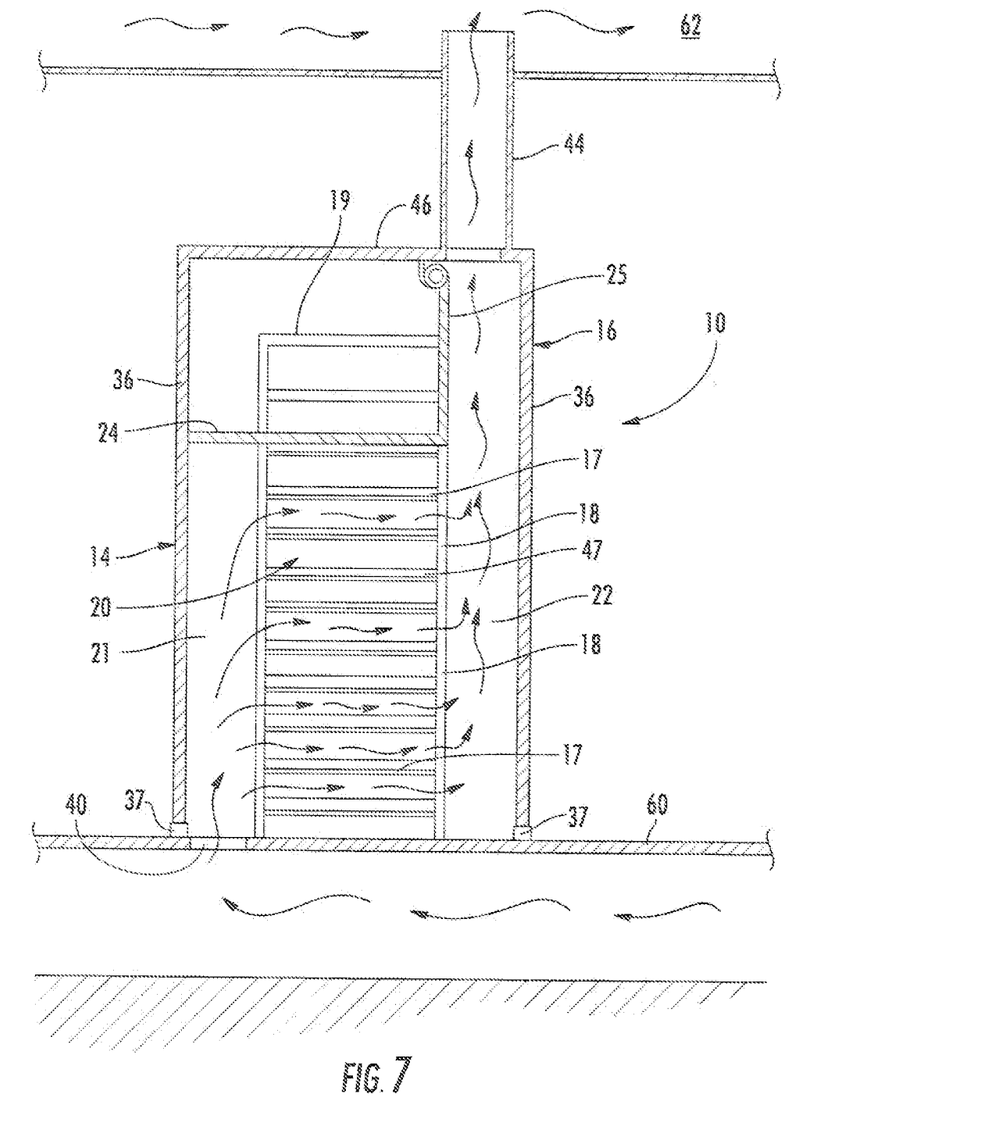
FIG. 7 is a side sectional view of the thermal management cabinet of FIG. 1, showing example airflow patterns.
Figure 8:
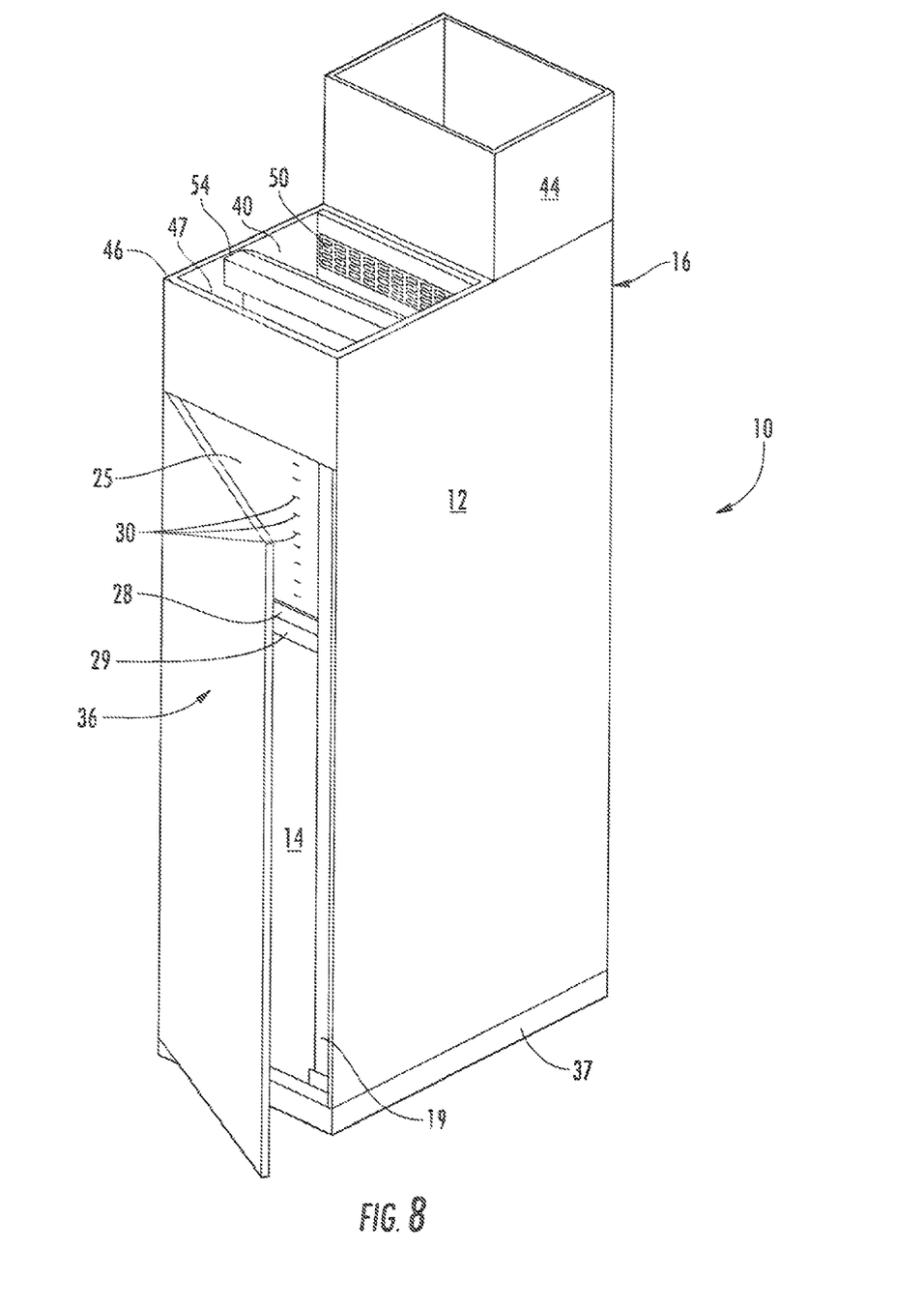
FIG. 8 is a front perspective view of an alternative arrangement of thermal management cabinet according to the invention.
Figure 9:
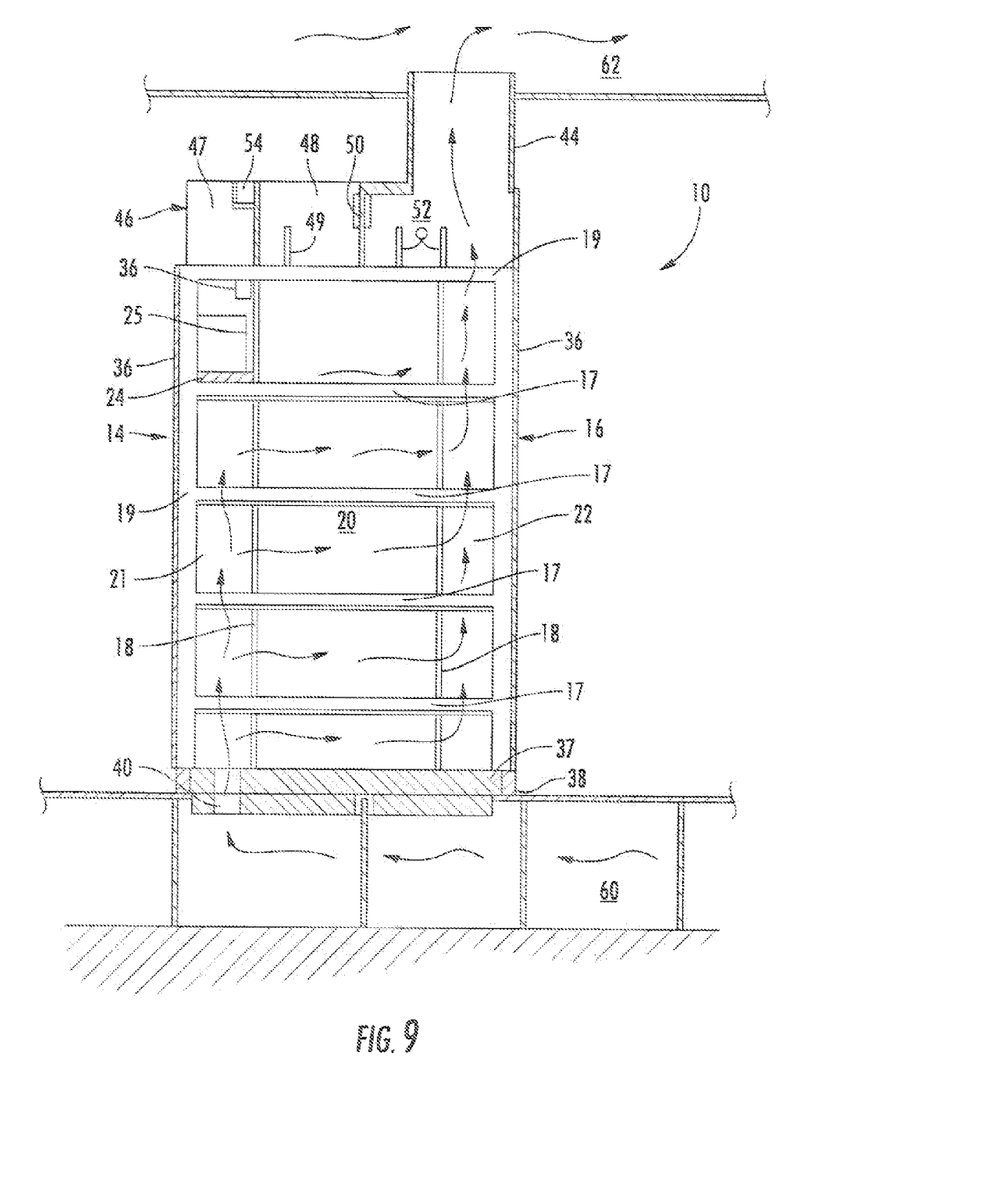
FIG. 9 is a side sectional view of the thermal management cabinet of FIG. 8, showing example airflow patterns.

In further alternative arrangements, as shown in FIGS. 8 and 9, the thermal management plate 24 can extend from the front 14 of the cabinet to the front vertical rail supports 18, and the thermal curtain 25 can be provided close to the front vertical rail supports. This creates a smaller neutral heat zone but still performs the function of preventing the cold zone from extending the full height of the cabinet 10 when the electronic components are not necessarily stacked up to the top of the cabinet 10.

Figure 10:
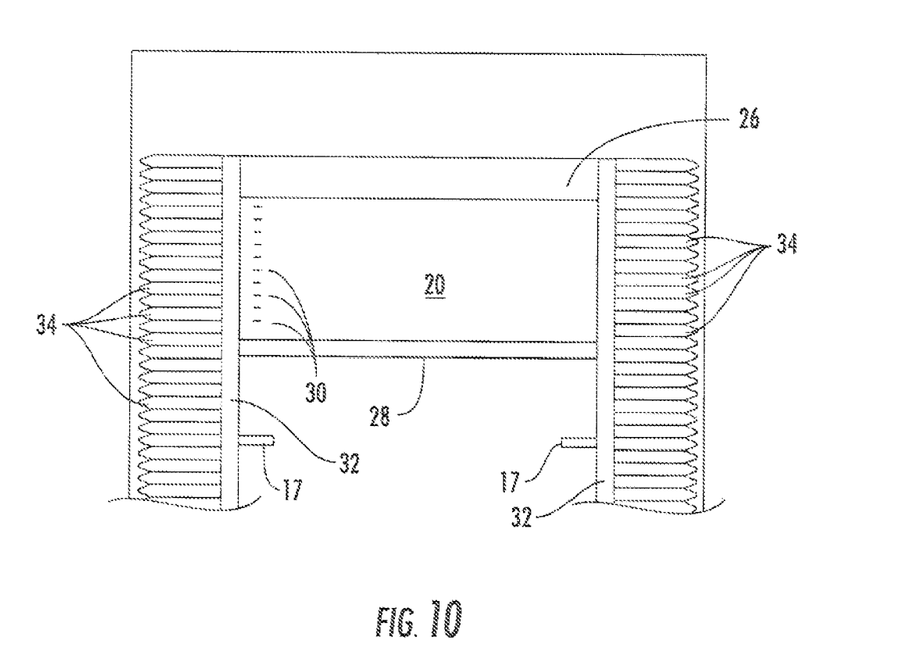
FIG. 10 is a view showing the flexible fingers used in the thermal management cabinet of FIG. 1.

Adjacent to the vertical rail supports 18 at the front 14 and back 16 of the cabinet 10, a plurality of air management fingers 34 and/or brushes 35 can be provided, which can extend to the sides or front/back of the cabinet 10 (see, e.g., FIG. 10). The fingers can be formed of a non thermally conductive flexible material, such as a foam, rubber or plastic material. The fingers 34 can be generally rectangularly shaped and can be attached at one end only to a support which is attached the rail supports 18. Each finger can be separately moveable, and can allow cables to be passed therethrough by pushing the cables inbetween adjacent fingers 34. The brushes 35 can be similarly arranged, attached at one end only to the rail supports 18. Alternatively, the brushes 35 can be provided on supports on either side of the gap between the rail supports 18 and the sides/front/back of the cabinet such that the brushes meet in the middle. In one arrangement, a set of fingers 34 can extend from the rail supports 18 to the sides 12 of the cabinet at the rear edge of the front service space 21. A set of brushes 35 can extend from the rail supports 18 to the rear 16 of the cabinet 12. The side service areas 23 can thus be defined by the fingers 34 and brushes 35, such that they are bounded at the front by the fingers 34, at the sides by the sides 12 of the cabinet at the sides of the electronic components stored in the storage area 20 and the brushes 35, and at the rear by the rear 16 of the cabinet. The side service areas 23 can thus be generally separated from the airflow in the cabinet by the fingers 34 and/or brushes 35, which form baffles, and the side service areas 23 thus form secondary neutral heat zones. It will of course be appreciated that any arrangement of brushes and/or fingers can be employed to both provide a separation of the air flow from the side service areas 23 and still to allow cables to be threaded into and through the side service areas 23 for appropriate cable management purposes.

In another arrangement, in place of or in addition to fingers 34 or brushes 35, flexible foam insulation pieces 33 can be used. The foam pieces may be provided in two parts; a generally thin rectangular piece 33*a* may be extended vertically from the cut corners of the thermal management plate 24, and a generally triangular-section piece 33*b* may be attached to a door 36 of the cabinet. When the door 36 is closed, the two foam pieces 33*a* and 33*b* can abut one another. Cables can then be run from the electronic components stored on the rack through the abutting foam pieces 33*a*, 33*b*, to the side service areas 23. The foam insulation pieces 33 can thus form baffles between the cold zone and the neutral heat zone of the side service areas 23.

The sides 12 may each include one or more removable side panels to allow access between cabinets. The sides 12 and side panels may be constructed of lightweight composite materials with non thermal conductive properties. Insulation may also be provided on the side panels. In some arrangements, the sides 12 may include one or more punch out panels so that cables may be run from servers stored in one cabinet 10 to servers stored in another cabinet 10. As the side service areas 23 are generally neutral air zones, it does not affect the cooling capabilities of the cabinet airflow to provide punch out holes in the sides.

The back 16 and the front 14 may both include one or more doors 36. The door 36 may have a side hinge, and may be constructed of lightweight composite materials similar to the sides 12, and may also be insulated. Alternatively, a double door may be provided, which has the advantage of allowing a decrease in necessary aisle space between cabinets that face one another. The door may include a temperature sensor that may be viewed without opening the door. The temperature sensor may be provided behind a window in the door, or may have a sensor part mounted inside the cabinet and a display part mounted on the outside of the door. The door may include a combination lock, or other locking mechanism. A rubber or other seal (not shown) may be provided around the doors 36, to help to seal any air gaps that might be created.

The cabinet 10 may be mounted on a modular base 37, forming a bottom 38 of the cabinet. The base may measure 3' wide by 4' long, and may allow access to a raised floor system 60 such as a TATE 24"×24" modular access floor system. A front section 40 of the base 37 is open to the subfloor, and registers with corresponding openings that are created to the raised floor system. A plurality of feet 42 are provided to bear the weight of the cabinet. A skirt (not shown) may surround the feet to prevent cool air from exiting around the base 37.

An airflow duct or chimney 44 may extend from a top 46 of the cabinet 10. The duct 44 can extend generally from an area of the top 46 that is adjacent to the back 16 of the cabinet. The duct 44 is dimensioned to extend into a ceiling space 62 such as an above-ceiling plenum for venting hot air to a venting means (not shown). The duct 44 may be flexible so that it can be easily connected to the ceiling even in the event of imperfect positioning of the cabinet 10 below a vent panel into the ceiling space 62. In one arrangement, the duct 44 can be formed of a flexible fabric or plastic material. Alternatively, the duct 44 can be formed of a rigid material. The ceiling space 62 may be a standard drop ceiling system. Various components can be provided in the top 46 such as a power raceway 47 and a public communications raceway 48, both of which may be open to the room. A divider 49 may divide the public communications raceway 48 for fiber and copper cables. A patch panel 50 can extend from the public communications raceway into a private communications raceway 52 for pass through of cables into the interior of the cabinet 10. Dividers 53 may be included in the private communications raceway 52 for dividing the space for fiber and copper cables. Junction boxes 54 may be provided in the power raceway 48a for supply of power to the power circuit in the cabinet. Power strips 56 and cable managers 58 may be provided adjacent the back 16 of the cabinet 10. It will be appreciated that the arrangement of components at the top 46 of the cabinet 10 can be varied to suit the particular application.

In use, the cabinet 10 is installed over a raised access floor 60 that is provided with cooled air from an HVAC or other system. The base 37 is registered with openings in the floor 60. The chimney is extended into a drop ceiling 62. The electronic components are installed on rails 17, and are appropriately cabled by passing cables through the foam pieces 33, fingers 34 and/or brushes 35 into the side service areas 23. Standard cable management ladders may be employed in the side service areas 23 to hold the cables at the right height and to allow them to be passed to the tops of the cabinet. The cables are run to the top of the cabinet 10 for connection to the power supply and to communications cables, which may be connected to other servers using standard overhead ladder racks. The doors 36 are then closed. As the electronic components are operated, they generate heat which is forced to the rear service area 22 by the airflow coming into the cold zone of the front service area 21 of the cabinet via the aperture 40 at the front of the cabinet. The hot zone created in the rear service area 22 due to the heating effect of the electronic components causes the air to flow up through the duct 44. The air thus circulates from the cold zone, through the electronic components in the storage area 20 to the hot zone and up into duct 44. The various baffles such as the thermal management plate 24, thermal curtain 25 and foam pieces 33, fingers 34 and/or brushes 35 constrain the airflow into the smallest possible space within the cabinet, and prevent hot and cold air mixing other than through the electronic component storage area 20.

Figure 11:
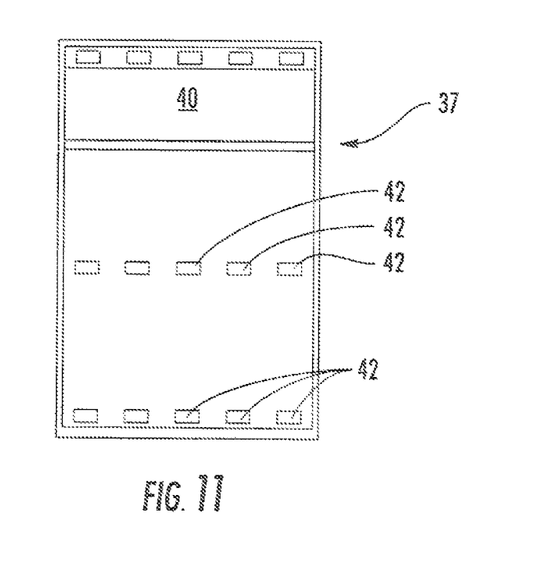
FIG. 11 is a bottom view of a modular base for the thermal management cabinet of FIG. 1.
Figure 12:
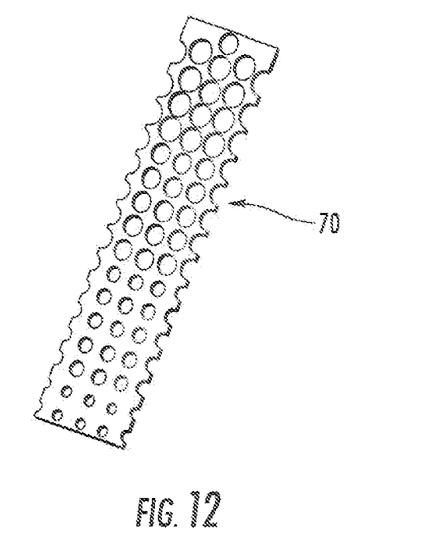
FIG. 12 shows a perforated curtain for use in the thermal management cabinet according to the present invention.
Figure 13:
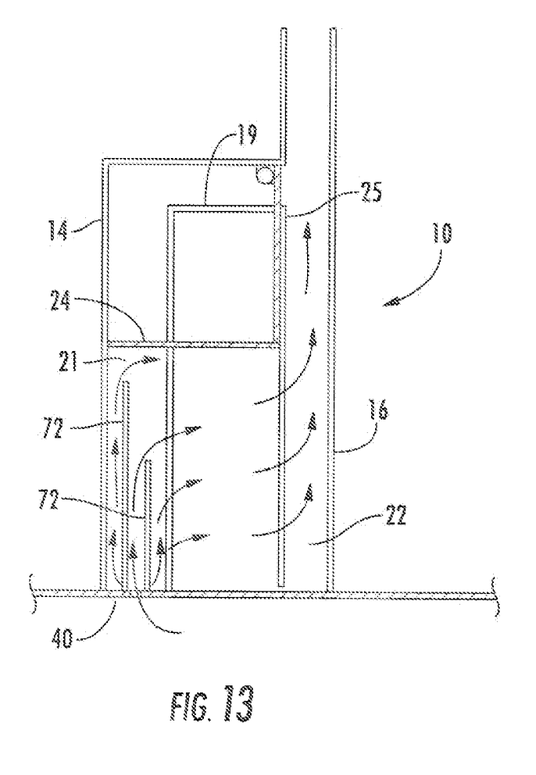
FIG. 13 is a side view showing airflow plates for use in the thermal management cabinet according to the present invention.

In order to ensure that sufficient cool air is delivered to the upper most electronic components, one or more flow diverters can optionally be used. For example, a perforated curtain 70 as shown in FIG. 11 or a series of plates 72 as shown in FIG. 12, may be used. Such arrangements can help to keep cool air flowing towards the top servers rather than allowing it all to be directed to the lower servers.

The illustrations of arrangements described herein are intended to provide a general understanding of the structure of various embodiments, and they are not intended to serve as a complete description of all the elements and features of apparatus and systems that might make use of the structures described herein. Many other arrangements will be apparent to those of skill in the art upon reviewing the above description. Other arrangements may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Thus, although specific arrangements have been illustrated and described herein, it should be appreciated that any arrangement calculated to achieve the same purpose may be substituted for the specific arrangement shown. This disclosure is intended to cover any and all adaptations or variations of various embodiments and arrangements of the invention. Combinations of the above arrangements, and other arrangements not specifically described herein, will be apparent to those of skill in the art upon reviewing the above description. Therefore, it is intended that the disclosure not be limited to the particular arrangement(s) disclosed as the best mode contemplated for carrying out this invention, but that the invention will include all embodiments and arrangements falling within the scope of the appended claims.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

What is claimed is:

1. A thermal management cabinet for electronic equipment, comprising:
    a cabinet frame having side walls and defining a front, a back, a top and a bottom, the cabinet forming a generally sealed enclosure for electronic equipment;
    an electronic component storage area including at least one shelving rack for supporting electronic equipment in an interior section of the cabinet;
    at least one inlet into a cool zone; and
    at least one outlet out of a hot zone;
    a baffle forming a neutral zone in the interior section, the baffle having a horizontal member separating a neutral zone from the cool zone, the baffle having a vertical member separating the neutral zone from the hot zone, wherein the neutral zone is substantially isolated by the baffle from air flowing through the cool zone and the hot zone.

2. The thermal management cabinet according to claim 1, wherein baffle is vertically moveable.

3. The thermal management cabinet according to claim 2, wherein the baffle comprises a thermal management plate that is formed of insulated material.

4. The thermal management cabinet according to claim 3, wherein the thermal management plate is formed of a plastic material backed with an insulator.

5. The thermal management cabinet according to claim 1, wherein the baffle comprises at least one of foam insulation and brushes.

6. The thermal management cabinet according to claim 5, wherein the brushes extend from the electronic component storage area to at least one of the side walls, front and back of the cabinet.

7. The thermal management cabinet according to claim 5, wherein the at least one foam insulation comprises two flexible foam pieces positioned to allow cables to be passed therebetween.

8. The thermal management cabinet according to claim 1, wherein the horizontal member is positionable.

9. The thermal management cabinet according to claim 1, wherein the horizontal member and vertical member are each independently positionable to change a size of the neutral zone.

10. A thermal management cabinet, for electronic equipment, comprising:
    a cabinet frame having side walls and defining a front, a back, a top and a bottom, the cabinet forming a generally sealed enclosure for electronic equipment;
    an electronic component storage area including at least one shelving rack for supporting electronic equipment in an interior section of the cabinet;
    at least one opening in the top of the cabinet; and
    at least one opening in the bottom of the cabinet;
    at least one baffle in the interior section of the cabinet forming a neutral zone in the interior section, wherein the neutral zone is substantially isolated by the at least one baffle from air flowing through a cool zone and a hot zone, wherein the at least one baffle comprises a horizontal member and a vertical member, wherein the horizontal member separates the neutral zone from the cool zone and the vertical member separates the neutral zone from the hot zone;

wherein the cabinet is dimensioned to extend between a raised access floor of a building and a drop ceiling of a building, the access floor carrying cooled air and the drop ceiling venting heated air, wherein the bottom opening of the cabinet is alignable with an opening in the access floor such that air from the access floor passes into the cabinet, flows through the cool zone, flows through the electronic component storage area, and flows through the hot zone to exit the cabinet through the top opening, which is alignable with an opening in the drop ceiling.

\* \* \* \* \*